United States Patent [19]

Brandolf

[11] Patent Number: 4,511,593

[45] Date of Patent: Apr. 16, 1985

[54] VAPOR DEPOSITION APPARATUS AND METHOD

[75] Inventor: Henry E. Brandolf, Inver Grove Heights, Minn.

[73] Assignee: Multi-Arc Vacuum Systems Inc., Saint Paul, Minn.

[21] Appl. No.: 458,011

[22] Filed: Jan. 17, 1983

[51] Int. Cl.³ .............................................. B05D 3/06
[52] U.S. Cl. ..................................... 427/37; 118/50.1; 118/723; 204/192 N; 427/38
[58] Field of Search ........................ 427/37, 38, 39, 40, 427/41; 118/715, 723, 50.1; 204/164, 192 R, 192 N

[56] References Cited

U.S. PATENT DOCUMENTS

| | | | |
|---|---|---|---|
| 2,378,476 | 6/1945 | Guellich | 118/723 |
| 3,625,848 | 12/1971 | Snaper | 427/37 |
| 3,677,924 | 7/1972 | Cash et al. | 204/192 R |
| 3,900,585 | 8/1975 | Matsubara | 427/39 |
| 4,094,764 | 6/1978 | Boucher et al. | 204/192 N |
| 4,279,216 | 7/1981 | Buhl et al. | 118/723 |
| 4,351,855 | 9/1982 | Pinkhasov | 118/723 |

Primary Examiner—John H. Newsome

Attorney, Agent, or Firm—Merchant, Gould, Smith, Edell, Welter & Schmidt

[57] ABSTRACT

A method and apparatus for vapor depositing node-free coatings on substrate surfaces, without altering the precoating substrate surface dimension, are disclosed. A gaseous plasma (50) is generated within an evacuated deposition chamber (20) from a source (40) of coating material. The plasma generation is preferably performed by electric arc vapor deposition techniques. Means, preferably a shield (60), are disposed in the chamber to intercept a portion of the plasma stream and to define a shadow region (60') that is substantially void of plasma particles traveling in a line-of-sight path from the source (40). Substrate(s) (30) to be coated are placed within the shadow region and are coated by that portion of the plasma diffusing into the shadow region. The substrates may be biased to ionically attract plasma ions. The shield (60) can be heated by ion bombardment of the plasma and positioned to heat the substrates by radiation. The shield may be electrically biased to enhance the coating operation. Substrates of substantially differing masses and shapes can be simultaneously coated.

21 Claims, 11 Drawing Figures

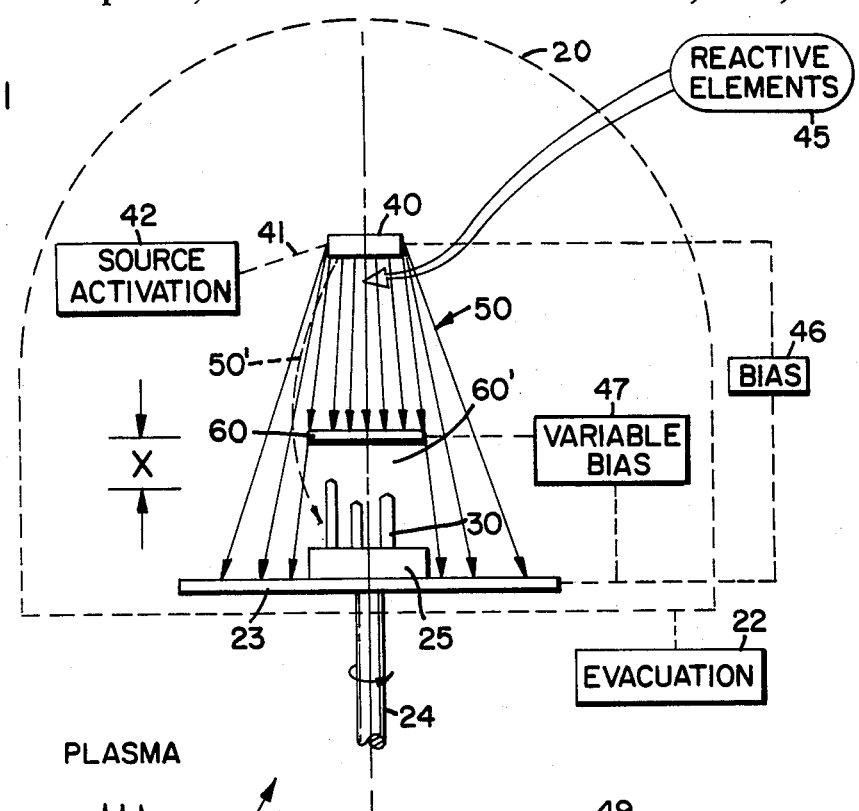
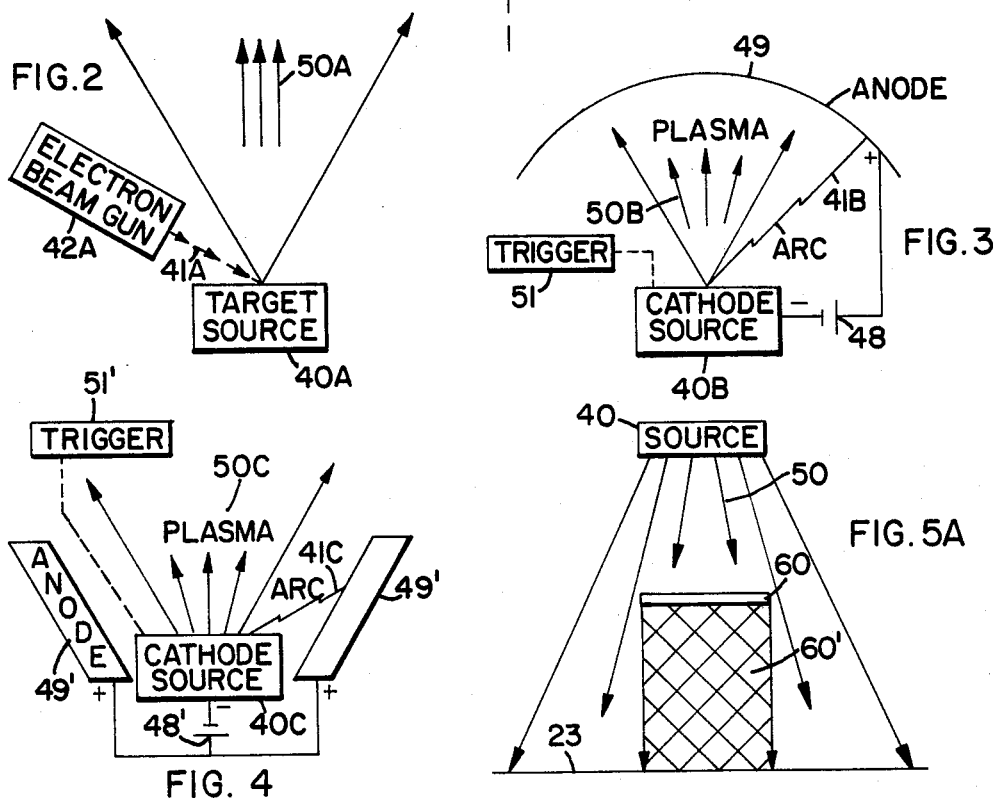

VAPOR DEPOSITION APPARATUS AND METHOD

FIELD OF THE INVENTION

This invention relates generally to vapor deposition coating, and more particularly to an apparatus and method for vapor depositing in a vacuum, a uniform node-free coating on a substrate in a manner that preserves the pre-coating surface finish dimensions of the substrate.

DESCRIPTION OF THE PRIOR ART

A number of disciplines have been developed over the years in the vapor deposition art for applying or depositing a coating layer on a substrate surface within a coating chamber. Certain fundamental process steps are the same for all of the vapor deposition disciplines, although a large number of variations and techniques in implementing the process steps have been developed. Generally, the substrate to be coated is placed within a deposition chamber which is evacuated or pressurized to the desired pressure. The coating material to be deposited on the substrate, is generated within or introduced into the chamber, and assumes the form of a plasma that includes gaseous vapors and solid particulate matter. The plasma may include atoms, molecules, ions and agglomerates of molecules of the coating material as well as those of any desired reactant agents and those of undesired impurities. The coating or deposition process itself occurs by condensation of the plasma coating particles onto the substrate surface(s) to be coated, and can be assisted by creating ionic attraction between the plasma particles and the substrate surface(s), or by guiding the plasma particles toward the substrate surface(s) with the aid of magnetic or electric fields.

For simplicity, the vapor deposition art can, be grouped into the "chemical vapor deposition" and the "physical vapor deposition" disciplines. Chemical vapor deposition generally refers to that vapor deposition process of the type above described, wherein the coating plasma is formed by introducing reactive gaseous elements into the deposition chamber, which gaseous elements react to form gaseous compounds that comprise the coating plasma. Chemical vapor deposition techniques do not require evacuation of the deposition chamber and in fact are often performed at positive (above atmospheric) pressure levels. Another characteristic typical of chemical vapor deposition techniques is that the plasma does not typically follow a straight-line, or line-of-sight path from the reactive source within the chamber.

The term physical vapor deposition, as used herein and to which this invention applies, refers to that vapor deposition discipline wherein the deposition chamber is evacuated and wherein at least a part of the coating material to be deposited is initially present in the deposition chamber as a solid source material and is acted upon by a stimulus that converts the solid source material into a plasma containing vaporized source material that may further be combined with other gaseous elements within the chamber, to form coating compounds and molecules prior to deposition onto the substrate surface(s). For example, a solid source material of titanium (Ti), once vaporized in the form of Ti atoms or ions, can subsequently be caused to react with nitrogen (N) gas to form TiN molecules and ions which form a portion of the coating plasma. In general, with physical vapor deposition techniques, the coating process is performed by plasma particles traveling in generally straight lines, in line-of-sight manner from the coating source material to the substrate being coated. The most commonly used physical vapor deposition techniques for converting the solid coating material to a plasma are: the resistence or induction heating method; the electron beam or ion bombardment method; and the electric arc method.

In the resistence or induction heating method, the coating source material is placed within a crucible which is heated to its melting point, or is directly melted by passing high current levels through the source material itself. As the source material melts, a portion thereof changes states, vaporizing into the chamber to form the coating plasma. This technique has been used for depositing thin film circuit patterns on hybrid circuit substrates and for depositing metalization interconnection patterns and layers on semi-conductor chip surface.

For the purpose of this specification, the electron beam and ion bombardment techniques for converting the solid source material into a plasma have been combined due to their similarity in nature. In the electron beam technique, a beam of high-energy electrons are directed toward and impinge upon the solid coating source material (referred to as the "target" for the electrons). In the ion bombardment technique, the electron beam is replaced by a high-energy beam of ions directed toward the target source material. The force of the bombarding electrons and/or ions imparts sufficient energy to the atoms and molecules of the target source material, to cause the energized atoms, molecules and agglomerates of molecules to physically leave the target source material in the form of the gaseous coating plasma. This physical vapor deposition method, while more practical than the resistence or inductive heating method, for coating larger workpieces such as cutting tools, is costly due to the expensive equipment required for generating and directing the electron beam toward the target area.

The third physical vapor deposition method referred to above (i.e. the electric arc method) generates an electric arc between the coating material source which generally acts as a cathode, and an anode, spaced from the cathode source, to vaporize the coating source material directly into its gaseous plasma state. The termination of the electric arc on the cathode source material forms a visible cathode spot that moves in random erratic manner across the surface of the source material, vaporizing the coating source material in the process. The electric arc method has been found to be particularly attractive to the commercial coating of substrates such as cutting tool surfaces.

A common practice that has been used in the electron beam/ion bombardment and the electric arc techniques has been to heat the substrate before and during the deposition process. This has typically been accomplished by the use of resistance radiation heaters or by biasing the substrate so as to cause electrons and/or ions within the coating plasma to be accelerated toward and to bombard the substrate material, simultaneously cleaning and heating the substrate material. It has been thought that such substrate bombardment improves adhesion of the coating material to the substrate.

It has been found that the prior art physical vapor deposition methods commonly used, and in particular the electron beam/ion bombardment and the electric arc techniques, which use ion bombardment cleaning and heating of the substrate as well as a line-of-sight deposition process, form a coating layer on the substrate that is not particularly smooth. When microscopically examined, such coatings have been found to contain a number of nodules, which significantly alter the substrate surface finish dimensions. For example, it is not uncommon for a substrate surface having a 5 micro-inch RMS surface measurement before coating, to have a measurement of 30 micro-inch RMS for its surface finish following a physical vapor deposition coating process by either the electron beam/ion bombardment or electric arc techniques described above. While such change in surface finish dimensions following a coating operation is generally of little significance when wear coat surfaces of such coatings as titanium nitride are applied to the cutting edges of larger drills, cutting bores or the like, there are applications (as for example, fine-edged tools) that cannot withstand such post-coating surface dimension changes. If such standard node-containing coatings are applied to finely lapped (as for example diamond lapped) edges and surfaces, the nodular roughness of the coating itself destroys or impairs the edge or surface of the tool to such an extent that the desired dimensional tolerance of the edge or surface is operatively destroyed.

It has been found that the nodular nature of the applied physical vapor deposition coating can be attributed to: (1) the direct deposition of large aggregates of molecules from the coating plasma onto the substrate surface: and (2) nodular growth in the coating material on the substrate surface as a result of thermal irregularities on the substrate surface. Both of these conditions are caused in part by the direct line-of-sight deposition techniques employed by prior art physical vapor deposition techniques. For example, direct electron and/or ion bombardment methods for cleaning and heating the substrate cause highly localized thin surface layers on the substrates to become overheated, particularly where excessive electron leakage points occur and along fine edges and point surface irregularities on the substrate. Nodes formed by columnar growth in the deposited coating have been found to grow much faster at such localized overheated areas. Similar columnar growth nodes have been observed on surfaces of substrates that have been heated by radiation, resistance or induction, wherein reflective and absorptive non-uniformities exist on the heated surfaces.

The present invention provides an apparatus and method for vapor depositing coatings on substrates without the formation of undesired nodular irregularities. With the present invention, the dimensional surface tolerances of the substrate being coated are maintained after the coating process.

Another problem with the prior art vapor deposition techniques which have depended upon a line-of-sight deposition path between the coating source material and the substrate has concerned the orientation of the substrate surfaces to be coated relative to the deposition source. In general the substrate surfaces to be coated had to be oriented generally perpendicular to the plasma line-of-sight flow and in ordered arrangement to avoid masking such line-of-sight from one substrate to the next. Care also has to be taken to insure that the deposited coating is uniformly applied to all surfaces of the substrate which are to be coated. Typically, this has required rotation of the substrate relative to the plasma source. Substrate rotation can become quite difficult in an evacuated and elevated temperature system, and requires strategic substrate placement within the evacuated chamber so as to avoid masking or blocking of the line-of-sight deposition path of one substrate, by another.

Another shortcoming of prior art physical vapor deposition techniques is that such techniques have generally not permitted piece parts (i.e. substrates) of different sizes, masses and shapes to be simultaneously coated in the same batch (i.e. evacuation, or deposition run). This is a result primarily of the different heating response characteristics exhibited by substrates of different mass and shapes, when subjected to ion or electron bombardment in line-of-sight deposition techniques. Further, it is very difficult to coat very small substrates with ion bombardment techniques due to the tendency to severly overheat and damage the small substrate. Another problem associated with prior art coating processes is that such processes can be susceptible to microarcing between substrates causing surface damage to the substrate coating as a result of localized overheating.

The present invention directly address the above-problems. The coating process of this invention does not use a line-of-sight deposition process, which permits simultaneous deposition/coating of different shapes and configurations of substrates having significantly different masses. The present invention provides an extremely simple and cost-effective method of vapor depositing coatings on substrates, in a manner that significantly enhances batch-fabrication techniques, in a manner that maintains the pre-coating dimensional surface tolerances of the substrates and in a manner that displays coating adhesion characteristics heretofore thought possible only by the use of direct line-of-sight deposition coating processes.

SUMMARY OF THE INVENTION

The present invention provides a physical vapor deposition method and apparatus for depositing coatings on substrates within an evacuated chamber, in layers of atomic and molecular thickness, in a manner which maintains the lap measurement surface integrity of the substrate surface that existed prior to the deposition coating process. The invention is applicable to the deposition of conductor, semiconductor and insulator materials, enables a number of substrates of different size, mass and configuration to be simultaneously coated, and does not require any particular relative orientation or positioning of the substrate surfaces to be coated.

One embodiment of the invention includes vapor deposition apparatus having an evacuation chamber which defines a deposition chamber suitable for evacuation. The chamber may be evacuated down to any pressure level, and preferably down to at least $2 \times 10^{-3}$ torr. A source of coating material is placed within the chamber and means are provided for acting on the source of coating material, to convert the source material from a solid phase to its vapor or gaseous phase, which forms a plasma of coating material particles which eminate outwardly from the source. A substrate having at least one surface area to be coated is placed within the evacuation chamber, and deflection means are operatively disposed in the chamber for blocking movement of the coating plasma particles in a line-of-sight path from the source to the substrate. A preferred construction of the deflection means comprises shield means mounted in the chamber between the source and the substrate for blocking or altering movement of line-of-sight plasma particles between the source and the substrate, such that the substrate surface is coated substantially only by those coating particles of the plasma that diffuse around the shield means. The coating plasma assumes the form of gaseous vapor and solid particulate matter, typically comprising atoms, ions, molecules and agglomerates of molecules of the source material and any additional reactive elements that are introduced into the deposition chamber. Those plasma particles which diffuse around or through the shield means and which are deposited upon the substrate surface(s) typically comprise atoms and molecules.

The shield means generally intercepts at least a portion of the coating plasma, forming a volumetric shadow region within the plasma, that is defined by an absence of most such coating plasma particles traveling in a line-of-sight path from the source. The only substrate positioning required is that the substrate surfaces to be coated be placed within the protected volumetric shadow region of the shield. The heavier and more dense plasma particles which comprise agglomerates of molecules, are intercepted by the shield means, or pass outside of the protected volumetric shadow region of the shield means and are not deposited upon the substrate surfaces within the shadow region.

Vaporized plasma particles of the coating source material, in the form of atoms and ions, may be reactively combined with other gaseous elements to form molecules and ions. For example, the vaporized titanium atoms of a preferred titanium source material can be combined with nitrogen atoms to form TiN molecules. The coating plasma particles may be electrically charged or ionized and the shield member and substrate surfaces may also be selectively electrically biased to selectively attract or repel ion particles of the plasma.

The invention applies to the deposition of conductor, semiconductor and insulator source materials. The invention applies to all forms of physical vapor deposition apparatus and techniques, and is particularly applicable to those physical vapor deposition techniques which convert the source material to a plasma by electron beam, ion beam and electric arc techniques.

The shield means can also be used as a heat radiation source for heating the substrates to a predetermined temperature during the deposition cycle. The shield means can be appropriately biased (positively or negatively), or may remain electrically isolated, to regulate the degree of plasma particle bombardment and thus temperature of the shield as well as to provide ion movement control. Similarly, the material from which the shield is constructed and its relative shape, mass and configuration can be varied, as well as its relative spacing with respect to the substrates within its shadow region, to accurately and uniformly control the radiation heating of the underlying substrates. The radiation heating of the substrates by the shield means enables the substrates to be heated uniformly, without hot spots and localized temperature irregularities as is prevalent with heating by direct ion bombardment techniques. Also, heating of the substrates by the shield means enables substrates of significantly different mass and configuration to be placed within the protective shadow area of the shield means and to be simultaneously coated in a single deposition coating run. The shield means may also be constructed of a grid or mesh material. Since the substrate surfaces are coated only by those plasma particles which diffuse around or through the shield means, no particular orientation of the substrate surfaces within the protected shadow region is required during a deposition coating run, as long as the diffused plasma particles are able to reach a substrate surface that is to be coated.

The present invention enables thin, adhesive and uniform coatings of the plasma atom, ion and single molecule particles to be applied to the substrate surfaces, in a manner that effectively eliminates substrate surface and prevents deposition of agglomerates of coating material molecules which form deposition nodes on the coated substrate surfaces. Accordingly, the pre-coating surface lap finish dimensions of the substrate surfaces are preserved after the coating process.

The present invention includes a method of vapor depositing a coating material on a substrate surface within a vacuum chamber comprising the steps of: (a) generating a plasma of coating material to be deposited which contains particles comprising atoms, molecules and agglomerates of the molecules of the coating source material; (b) forming a volumetric shadow region within said plasma, said shadow region being defined by a substantial absence of those particles of the plasma traveling in line-of-sight direction from the situs or source of the plasma generation; (c) placing a substrate surface to be coated within the volumetric shadow region; and (d) coating the substrate surface in the shadow region by particles from the plasma. The above method may further be characterized by forming the volumetric shadow region within the plasma by inserting a shield member into the plasma for intercepting at least a portion of the plasma particles traveling in a direct line-of-sight path from the situs or source of the plasma.

The invention also includes a method of vapor depositing a coating material on a substrate surface in a vacuum chamber in a manner that preserves the precoating lap finish measurement of the substrate surface comprising the steps of: (a) introducing a coating source material into a vapor deposition chamber; (b) evacuating the chamber to a pressure of at least $2 \times 10^{-3}$ torr.; (c) generating a plasma from the coating source material which comprises at least atoms, molecules and agglomerates of the molecules of a coating source material; (d) directing a stream of the plasma outward from the source material; (e) selectively processing the plasma stream to remove a majority of the agglomerates of coating molecules from a defined region of the plasma stream; and (f) coating a substrate surface with the process plasma stream in the defined region, whereby the coating is formed primarily by atoms and molecules of the coating material and in a manner that substantially preserves the pre-coating lap finish measurement of the coating surface.

While the invention will be described with respect to a particular configuration of an evacuation and deposition chamber, it will be understood that other such configurations within the physical vapor deposition field are included within the scope of this invention. Further, while the invention will be described with respect to single-source deposition configurations, it will be understood that the invention applies to multiple-source systems as well. Also, while the preferred embodiments of the invention disclosed will illustrate specific shield means arrangements and particular orientations of substrates within the protected shadow region of the shield, it will be understood that other shield configurations and substrate orientation arrangements can be conceived by those skilled in the art. It will be understood that those skilled in the art may readily preceive yet other variations of the invention not specifically described in the specification, but clearly included within the scope of the appended claims.

BRIEF DESCRIPTION OF THE DRAWNGS

Referring to the Drawing, wherein like numerals represent like parts throughout the several views:

FIG. 1 is a diagrammatic view of a vapor deposition chamber arrangement employing the principles of this invention;

FIG. 2 is a diagrammatic view illustrating use of an electron beam gun technique for converting the coating source material of FIG. 1 to a plasma;

FIG. 3 is a diagrammatic view illustrating use of one anode arrangement of an electric arc technique for converting the coating source material of FIG. 1 to a plasma;

FIG. 4 is a diagrammatic view illustrating use of a second anode configuration of an electric arc technique for converting the source material of FIG. 1 to a plasma;

Figure 7:
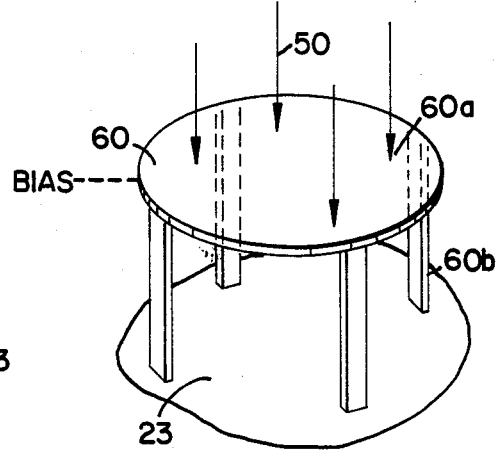
Figure 6:
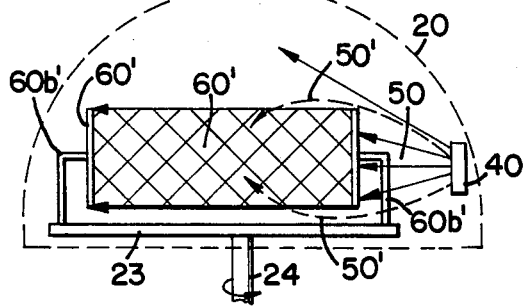
Figure 8:
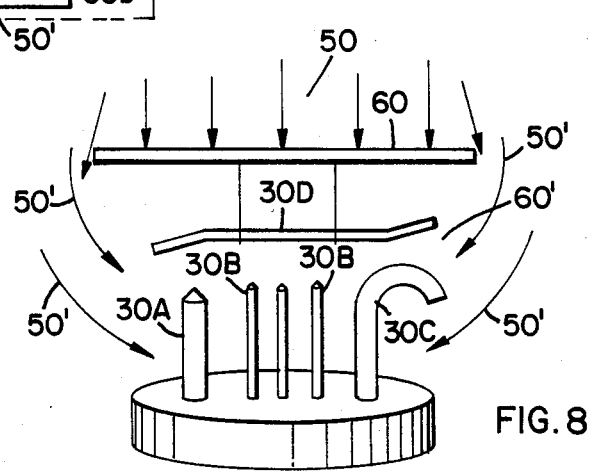

FIGS. 5A, B, C and D are diagrammatic illustrations of four different orientation and size arrangement of the coating source and shield members of the apparatus of FIG. 1, illustrating several different shadow configurations that can be produced thereby;

FIG. 6 is a diagrammatic view illustrating a coating source and shield arrangement laterally disposed within a deposition chamber;

FIG. 7 is a perspective view of one configuration of a shield member constructed according to the principles of this invention; and FIG. 8 is a diagrammatic view illustrating the application of the present invention to the simultaneous vapor deposition coating of surfaces of substrates having varied surface configurations, orientations and masses.

DETAILED DESCRIPTION OF THE INVENTION

Referring to the figures, there is generally illustrated in FIG. 1 a diagrammatic representation of a vapor deposition arrangement which practices the present invention. Referring thereto, there is generally illustrated at 20 a vapor deposition chamber, typically comprising a vacuum chamber suitable for evacuation by an appropriate evacuation means schemmatically illustrated at 22, as is well-known in the art. The deposition chamber 20 has mounted therein means for holding one or a plurality of substrates 30. Such support means can be of any configuration well-known in the art. The particular nature of such support means does not form a part of this invention other than to the extent such support means holds the substrates 30 to be coated in relative position to the other essential elements of this invention. In the embodiment illustrated in FIG. 1, the support means includes a platform 23 mounted for rotation on a vertically oriented shaft 24 by appropriate motor or rotary motion imparting means (not illustrated). A substrate holder base member 25 is carried by the platform 23 and holds the substrates 30 to be coated in a spaced-apart relationship to one another, as illustrated. It will be understood that appropriate seal means (not illustrated) are provided between the shaft 24 and the chamber 20 to maintain the vacuum within the chamber 20.

A source of coating material 40 is mounted in the chamber 20 and is disposed in spaced-apart relationship with the substrates 30. The source 40 as illustrated in FIG. 1, represents the situs of coating plasma generation for the vapor deposition operation. In the preferred embodiment, the source 40, as illustrated, represents a physical mass of coating material in a solid form. It will be understood, however, that the source 40 could assume forms other than the solid mass illustrated. Souce activation means 42 are provided for converting the coating source material 40 from a solid to a gaseous vapor phase. The signal flow or stimulus path between the source activation means 42 and the physical source material 40 is illustrated in FIG. 1 by the dashed line 41. When the source 40 is converted from a solid to a vapor or gaseous phase, it is referred to as a coating plasma, illustrated in FIG. 1 generally at 50. The plasma 50 generally contains neutral atoms, ions, molecules and agglomerates of molecules of the source material 40 as well as those of any reactive elements 45 with which the vaporized source material atoms, ions and molecules are combined prior to the deposition process. The reactive elements 45 are schemmatically illustrated in FIG. 1 as being added to the plasma 50 immediately "downstream" from the source 40 in a direction toward the substrates 30. While the source 40 is illustrated in FIG. 1 as "overlying" the substrates 30, it should be noted that such orientation is not important to this invention, as will become apparent from further description of the invention. As used herein, the various constituent portions of the plasma 50 will generally be referred to as the plasma "particles" or the coating species. In a preferred configuration of the invention, the coating source material comprises titanium (Ti) and the reactive element 45 comprises nitrogen (N). The "particles" of the plasma 50 accordingly include atoms of titanium and nitrogen, titanium ions, titanium nitride molecules, ionized titanium nitride molecules, agglomerates of titanium nitride molecules and possibly titanium and nitrogen molecules.

The shape of the plasma stream 50 from the source 40 will depend upon the method in which the plasma is generated, as well as by any ionization techniques and magnetic or electric field control techniques used. For simplicity, in description of the invention such structures have not been illustrated in the figure, except for the "bias" networks 46 and 47 (to be described in more detail hereinafter). In general, a significant number of the plasma particles 50 travel generally in straight lines outwardly from the source 40 in so-called "line-of-sight" paths illustrated in FIG. 1 by the straight lines comprising the plasma 50. The plasma 50, however, will also include particles which travel in random diffused paths, illustrated by the dashed line 50' in FIG. 1.

A shield member 60 is interposed within the plasma stream 50 between the source 40 and the substrates 30, so as to intercept particles of the plasma 50 traveling in line-of-sight paths from the source 40 toward the substrates 30, and in a manner so as to cast a "shadow" in the plasma stream 50 over the substrates 30. In other words, the shadow (illustrated at 60' in FIG. 1), is defined by that volumetric region within the plasma stream 50 that is shielded by the shield member 60 from the plasma stream 50 so as not to contain any significant number of such plasma particles traveling in a line-ofsight direction from the source 40. Non-line-of-sight plasma particles 50', however, can and do find their way into the shielded "shadow" area 60' and provide the means by which the substrates 30 are coated by the plasma stream 50.

The shield 60 may be of any suitable size, shape, mass, configuration, material and consistency, for providing the desired shield effect. Similarly, the shield 60 may be mounted in any appropriate manner within the deposition chamber 20. One possible configuration for the shield 60 is illustrated in FIG. 7, wherein the shield comprises an upper plate member 60a (which may be of solid or grid construction) for intercepting the line-of-sight traveling particles of the plasma 50, supported by a plurality of leg or support members 60b upon the platform 23. The support members 60b may be of conductive or insulating material, the selection of which material will depend upon how or if the shield will be electrically biased within the system. In a preferred construction, when used with electric arc deposition techniques, the shield member 60 is constructed of conductive material (stainless steel) so that it can be connected to an electric potential or biasing means 47. While the preferred construction of the shield member is of solid opaque conductive metal, it is conceivable within the scope of this invention that a shield could also be constructed of a screen-like material having, for example, a mesh grid with openings ranging from approximately 10 mesh to 352 mesh (standard sieve scale).

The Source Activation functional designation 42 of FIG. 1 represents the particular stimulus used in a physical vapor deposition system for converting the solid source material 40 into its gaseous plasma state. Accordingly, in a physical vapor deposition construction, the Source Activation 42 could be a resistance or induction heating apparatus (not illustrated); an electron beam structure (as basically illustrated in FIG. 2); or an electric arc structure (two possible configurations of which are illustrated in FIGS. 3 and 4). In an electron beam structure, the Source Activation functional block 42 comprises an electron beam gun 42A that produces a beam of high-energy electrons 41A which is directed, generally by magnetic or electric field structures (not illustrated) toward the coating source 40A. The electron beam energy converts the source target material 40A into its gaseous plasma state, generally illustrated at 50A, in a manner well-known in the art.

One vapor deposition technique using an electric arc for the source activation function is illustrated in FIG. 3. In electric arc vapor deposition arrangements, the coating source material 40B is typically biased by appropriate biasing means indicated at 48, to act as a cathode in the arc system. An anode 49 is positively biased with respect to the cathode, and an arc 41B is struck by a trigger apparatus (generally illustrated at 51), and thereafter maintained between the cathode source 40B and the anode 49 by the bias potential 48. The point at which the arc terminates at the cathode source 40B is typically referred to as a cathode spot, which moves in erratic random fashion along the surface of the cathode. The cathode source material is converted to its vapor phase at the situs of the cathode spot and forms the plasma 50B. The basic structure illustrated in FIG. 3 is well known in the art. One embodiment of such structure is described in more detail in U.S. Pat. No. 3,783,231 to Sablev. Other electric arc configurations are also known in the art. By way of example only, an electric arc-generating structure described in U.S. Pat. Nos. 3,625,848 and 3,836,451 to Snaper is diagrammatically illustrated in FIG. 4. In this configuration, the cathode source 40C is surrounded by a frusto-conical anode 49'. The cathode and anode are appropriately biased by a power source means 48', an arc 41C is struck by a trigger 51' and is thereafter maintained by the bias source 48' to generate the coating plasma 50C, as illustrated. In this configuration, the shape of the anode 49' also aids in defining the angle of projection of the plasma 50C from the cathode source 40C.

Figure 5B:
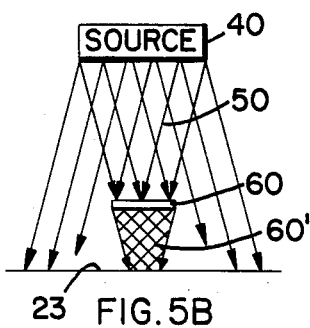
Figure 5C:
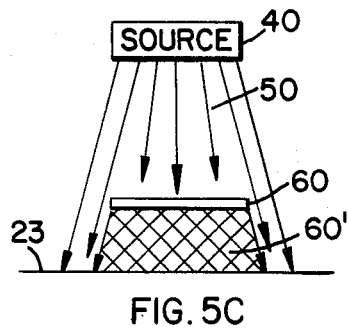
Figure 5D:
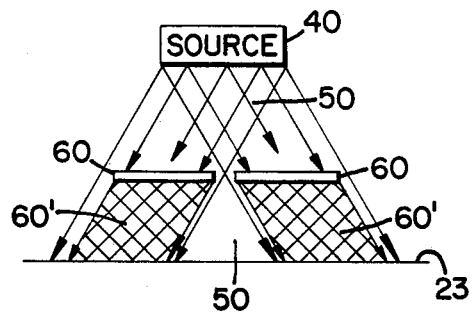

The size and shape of the shadow region defined by the shield within the plasma 50 can be varied as desired by varying the size and configuration of the shield 60 as well as its relative spacing with respect to the source 40. Several such variations are illustrated in FIG. 5. FIG. 5A illustrates a volumetric shadow region 60' of generally cylindrical configuration. The volumetric shadow region 60' of FIG. 5B is generally cone-shaped, and downwardly converging in the direction of flow in the plasma 50. The shadow region of FIG. 5C illustrates a downwardly diverging truncated cone shaped region. Many variations of the basic screen or shield 60 concept are possible as illustrated by the split shield structure in FIG. 5D.

While FIGS. 1 through 5 have illustrated the source and screen members to be generally vertically aligned with one another, it will be understood that such representation has merely been used for the sake of convenience. In commercial vapor deposition installations, it is fairly common to arrange one or more coating material sources 40 around the periphery of the deposition chamber 20 as diagrammatically illustrated for one such source 40 in FIG. 6. In such configurations, the plasma 50 may project laterally outward from the source 40, and the shield arrangement may comprise a cylindrical shell member 60, either placed directly on the platform 23 or raised from the platform 23 on support struts or legs 60b, as illustrated. With such a "raised" shield placement, plasma particles can diffuse around both the top and bottom of such shield as indicated at 50'. The substrates to be coated according to the provisions of this invention will be placed within the shadow region 60' defined by the shield 60.

Besides defining a shadow region within the plasma 50, the shield member 60 can effectively be used in high-energy vapor deposition systems such as in ion bombardment and electric arc deposition systems, to radiate "heat" to the substrate surfaces being coated. Since the shield 60 protects the substrates lying within its shadow 60' from "direct" ion bombardment from line-of-sight particles within the plasma 50, such substrates will not primarily be heated by the plasma 50 during the deposition process. However, the shield member 60 itself can be biased by an appropriate bias source 47 (see FIG. 1) to receive bombarding ions from the plasma 50. The degree of bombardment can be controlled by the biasing levels applied to the shield. As the shield is bombarded by the ions and other particles of the plasma 50, its rising temperature can be fairly uniformly radiated to the substrates lying within its shadow, to provide uniform heating to the underlying substrates, without concern for localized hot-spots due to surface irregularities and pointed or sharp edges (of for example cutting tools). In other words, the shield acts as a radiator for the substrates being coated, and eliminates the non-uniform heating problems heretofore associated with the direct ion bombardment heating of the substrates to be coated. The heating process can be controlled not only by the biasing levels applied to the shield 60, but also by the type and thickness of the material selected for the shield, as well as the relative spacing (illustrated at "X" in FIG. 1) between the shield 60 and the substrates 30 to be coated.

Therefore, the shield can be designed and used merely as a shield, to enhance radiant heating of the substrates, or to act as a bias control of both heating and the deposition process. For example, a shield of relatively thick cross-section can be used as a heat sink whereas a shield of thin or light cross-section may be selected to radiate higher temperatures to the substrates. As previously stated, the shield may be opaque or of a mesh construction that would allow relatively few and only the smallest plasma particles to "penetrate" the shield in a line-of-sight path from the source to the substrate. While the material from which the shield is made may vary, it must be stable enough to withstand the particular vacuum, temperature, and degree of ion bombardment environmental conditions that it will encounter in operative use. The shield material can also be selected for its "active" properties. It may be selected because of its getter action properties, because it can provide catalytic action, or because it can provide a selective reaction in the plasma. The shield can be electrically isolated or variably biased either negatively or positively to provide temperature control as above described, or to provide ion control (i.e. attraction or repulsion) during the process.

In the preferred embodiment use of a shield in an electric arc vapor deposition system, a shield of stainless steel similar to that of FIG. 7, measuring ⅛ inch thick, 4 inches in diameter and positioned 6 inches from a titanium plasma source, is used. Such deposition shield creates a shadow area over an effective substrate area of 12-inches in diameter. In the preferred embodiment, the shield is biased positively to repel positive ions of the titanium plasma, and the substrates being coated are biased negatively so that the ions deflected by the shield are attracted to the substrate. Non ionized plasma particles will travel freely within the chamber, and will not be affected by the shield member. The larger agglomerates, however, traveling in-line-of-sight paths from the source material will be deflected away from the substrates.

Elimination of direct ion bombardment heating of the substrates 30, by the plasma deflection shield 60 enables substrates of significantly different mass, size and shape to be simultaneously coated by the plasma 50. This situation is illustrated in FIG. 8. Heretofore, with the use of direct ion bombardment of the substrates 30, by the plasma 50, by the time a large-mass substrate 30A were heated to its desired deposition temperature, substrates having relatively smaller mass (such as illustrated at 30B) would have been severely overheated, causing possible damage to the smaller substrates and yielding non-reliable coatings.

With this invention the substrates 30 to be coated are coated by those atoms, ions and molecules of the plasma 50 which diffuse around the shield 60 and into the shield's shadow region 60'. As previously stated, when a mesh shield is used some smaller plasma particles may pass directly through the screen, but the larger agglomerate particles will be deflected. These plasma particles are diagrammatically illustrated at 50' in FIGS. 1 and 8. If the substrates 30 are not electrically biased, in case of a solid shield, deposition coating of their exposed surfaces will be performed primarily by condensation thereon of electrically neutral plasma particles 50' diffusing into the shadow region 60'. Due to the fact that the paths of the plasma particles 50' are not line-of-sight paths from the source 40, diffusion of the particles 50' will be entirely random and uniform within the shadow region 60', causing uniform deposition on all exposed surfaces of the substrates 30, without the need for rotation or movement of the substrates to accommodate line-of-sight deposition limitations. Accordingly, orientation of the substrates 30 within their respective holders need not be meticulously arranged, since line-of-sight deposition principles do not apply. Similarly, while rotation of the piece-part substrates being deposited is not necessary with the present invention, such rotation could still be employed if desired, as illustrated by use of the rotatable platform 23 in FIG. 1. Since the large agglomerates of molecules and the high-intensity ions in the plasma 50 generally travel in a line-of-sight motion, the majority of such particles will be deflected by the shield 60, and will not reach the substrates 30 protected within the shadow 60' of the shield. Accordingly, the substrates 30 will be coated primarily by single atoms, ion or molecule particles 50' of the plasma 50. To facilitate attraction of ion particles into the shadow region 60', the substrates 30 can also be biased by means of a biasing source 46 (FIG. 1) generally at a level sufficient to attract the ionic particles 50', but not at such a level so as to initiate ionic bombardment of the substrates themselves.

Since the large agglomerate and the high energy particles of the plasma 50 typically do not diffuse into the shadow region 60' of the shield 60, the substrates 30 are coated by the relatively smaller atom, ion and molecule particles 50' which effectively eliminates the accumulation of node-forming aggregates of molecules on the deposited surfaces. Furthermore, since the shield 60 absorbs the impact and energy of the large agglomerates of molecules and of the high energy bombarding particles, no hot spots or uneven heating of the substrates results, which minimizes thermal irregularities on the substrate surfaces which heretofore have given rise to nodes formed by columnar growth. From a process viewpoint the number of atoms and ions made available in the plasma within the chamber can be significantly increased by increasing the system arc power, heretofore not readily possible with arc deposition processes due to overheating of the substrates and due to the formation of adverse microarcs in the system. The resultant coating applied to the surfaces of the substrates, is a coating formed atom by atom and molecule by molecule, one which is extremely cohesive and one which identically follows the pre-deposition surface contour of the substrate, thus maintaining the lap finish dimensions of the pre-coated substrate.

In a simple surface integrity test measurement, the inventor compared two substrates having surfaces ground with a 220 grit wheel, which each measured 5 microinches RMS using a profilometer, before coating. After applying a titanium nitride coating using an arc deposition technique under the same deposition conditions with, and without the use of a shield member, the coated surface of the substrate without the use of a shield measured 30 micro-inches RMS, whereas the coated surface using a shield was preserved at the 5 micro-inch RMS dimension. Similar results have been found with the coating of extremely smooth surfaces of substrates that have been buffed by 0.25 micron diamond lapping compound. When coated by a deposition process without the use of a shield, the coated surface appeared to have a "satin" finish and the pre-deposition surface smoothness was severely impaired by the deposited coating. Microscopic examination of the coated surface revealed nodular growth and micropore irregularities in the coating. In contrast, substrates having the same pre-coating buffed surface smoothness, when coated according the principles of this invention, using a shield, displayed a surface having high luster, with no noticeable nodes or micropores in the finish when microscopically examined.

Accordingly, the principles of this invention are extremely applicable to the coating of such substrates as fine-edged tools and wear parts (such as bearings, circuit board drills, and the like) requiring smooth surface finishes. The invention is particularly applicable to the most popular commercial coating processes (i.e. electric arc deposition, electron beam deposition and ion beam deposition).

While the invention has been described primarily with respect to the coating of metals and metal compounds such as titanium and titanium nitride, the principles of the invention apply equally well to the deposition of semiconductive and insulator materials such as ceramics, and possibly to the deposition of gaseous reacted compounds.

From the foregoing description, it will be appreciated that the present invention solves many of the problems and deficiencies associated with the prior art vapor deposition coating processes. It will be understood that while the invention has been described with respect to particular vapor deposition coating examples, that the invention is also applicable to other configurations of vapor deposition apparatus known in the art, and covered by the following claims. It will also be understood that while the invention has been described with respect to a particular configuration and orientation of a shield member, that other types of shielding apparatus could equally well be employed within the scope of this invention. Other modifications of the invention will become apparent to those skilled in the art in light of the foregoing description. This description is intended to provide specific examples of individual embodiments which clearly distinguish and disclose the present invention. Accordingly, the invention is not limited to the described embodiments, or to the use of specific elements or process techniques described therein. All alternative modifications and variations of the present invention which fall within the spirit and broad scope of the appended claims are covered.

What is claimed is:

1. Vapor deposition apparatus, comprising:
   (a) evacuation chamber means defining a deposition chamber suitable for evacuation of the chamber down to at least $2 \times 10^{-3}$ torr.;
   (b) means disposed in said chamber for supplying a source of coating material;
   (c) means operative upon said source of coating material for converting said source material into a plasma of particles eminating outwardly from said source;
   (d) means for supporting a substrate of the type having at least one surface area suitable for receiving and for being coated by said plasma of coating material;
   (e) deflection shield means operatively disposed in said chamber between said source and said substrate supporting means for blocking movement of a majority of those said plasma particles traveling in a line-of-sight direction from said source to said supported substrate, wherein said blocked plasma particles strike and impart kinetic energy to said shield means, thereby heating said shield means; whereby said one substrate surface is primarily coated by said plasma particles that diffuse around said shield means; and
   (f) wherein said shield means and said substrate support means are spaced and arranged relative to one another such that said heat from said shield means radiates to and operatively heats said supported substrate.

2. Vapor deposition apparatus as recited in claim 1, further including means for injecting a second element in gaseous form, different from that of said source material into said plasma, for forming molecules of said source material and said second element within said plasma, said molecules comprising in part said plasma particles.

3. Vapor deposition apparatus as recited in claim 2, further including means for ionizing at least some of said plasma particles.

4. Vapor deposition apparatus as recited in claim 3, further including means for biasing said substrate surface to be coated, for causing ionic attraction of said ionized particles within said plasma.

5. Vapor deposition apparatus as recited in claim 1, wherein said apparatus is adapted for use with a source material of the type which when acted on by said means for converting said source into a plasma, forms a plasma containing atoms, ions, molecules and agglomerates of molecules; and wherein said shield means blocks movement of those said agglomerates of molecules that are traveling in said line-of-sight direction toward said substrate, thereby preventing deposition of said agglomerates of said molecules on said one substrate surface.

6. Vapor deposition apparatus as recited in claim 1 wherein said shield means and said substrate support means are spaced and arranged relative to one another in a manner so as to enable heating of said substrate surface, while minimizing heat concentration spots on said substrate surface; whereby columnar nodular growth of said coating material on said substrate surface during the deposition coating process is minimized.

7. Vapor deposition apparatus as recited in claim 1, wherein said means for converting said source material into said plasma comprises a beam of high-energy electrons directed toward said coating material source.

8. Vapor deposition apparatus as recited in claim 1, including biasing means operatively connected with said deflection shield means for applying an electrical potential to said deflection shield means.

9. Vapor deposition apparatus as recited in claim 8, wherein said biasing means includes variable biasing means for selectively varying the electrical potential applied to said deflection shield means.

10. Vapor deposition apparatus as recited in claim 1, wherein said means for converting said source material into said plasma includes arc generating means for generating and sustaining an electric arc to said source material, said arc generating means comprising:
   (a) said source material acting as a cathode;
   (b) an anode disposed so as to address said cathode source material;
   (c) arc initiating means for generating an arc between said cathode and said anode; and (d) biasing means for maintaining an arc sustaining electric potential between said anode and said cathode;

whereby an electric arc is generated and sustained between said anode and said cathode and terminates at a cathode spot on said source material at which spot said source material is converted into said plasma.

11. Vapor deposition apparatus as recited in claim 10, including second biasing means operatively connected for applying an electric potential to said substrate, whereby ions from said plasma are attracted to said substrate.

12. Vapor deposition apparatus as recited in claim 10, including deflector biasing means operatively connected with said deflection shield means, for applying an electric potential to said deflection shield means.

13. Vapor deposition apparatus as recited in claim 11, including deflector biasing means operatively connected with said deflection shield means, for applying an electric potential to said deflection shield means.

14. Vapor deposition apparatus as recited in claim 12, wherein said deflector biasing means is independently operable from said arc generating biasing means; whereby the electric potential applied to said deflection shield means can be varied independently from the arc generating potential.

15. Vapor deposition apparatus as recited in claim 13, wherein said deflector biasing means is independently operable from said arc biasing means and said second biasing means; whereby the electric potential applied to said deflection shield means can be varied independently from the arc generating potential or from that potential applied to said substrate.

16. Vapor deposition apparatus as recited in claim 15, including insulation means operatively connected with said deflection means for electrically isolating said deflection means from said anode, said source and said substrate.

17. Vapor deposition apparatus as recited in claim 1, further including means for supporting a plurality of said substrates, wherein said deflection shield means is operatively disposed to lie between said source and said plurality of substrates, and wherein said shield means and said means for supporting said plurality of substrates are spaced and arranged relative to one another such that the heat from said shield means radiates to and operatively heats said plurality of substrates.

18. Vapor deposition apparatus as recited in claim 1, wherein said means for supporting said plurality of said substrates is adapted to support substrates which have substantially different masses.

19. A method of vapor depositing a coating material on a substrate surface within a vacuum chamber in a manner which preserves pre-coating lap finish dimensions of the substrate surface, comprising the steps of:
  (a) introducing a coating source material and a substrate to be coated by said source material into a vapor deposition chamber;
  (b) placing a shield member within said vacuum chamber between said source material and said substrate such that said substrate lies in a shadow region of said shield member formed in a line of sight direction from said source;
  (c) evacuating said chamber to a pressure of at least $2 \times 10^{-3}$ torr;
  (d) generating a plasma of particles from said coating source material, said plasma particles comprising at least atoms, ions, molecules and agglomerates of molecules of said coating source material;
  (e) directing a high energy stream of said plasma particles outward from said source material and toward said shield;
  (f) bombarding said shield member with said high energy plasma stream particles, thereby imparting kinetic energy which heats said shield member, and thereby blocking movement of a majority of said agglomerates of molecules traveling in a line of sight direction from said source from reaching said substrate;
  (g) heating said substrate by said kinetic energy created heat radiated from said shield member; and
  (h) coating a surface of said substrate primarily with said atoms and molecules of said plasma stream that diffuse around said shield means in a manner that substantially preserves the pre-coating lap finish dimensions of said coating surface.

20. The method as recited in claim 19, wherein the steps of directing a stream of plasma particles and bombarding said sheild member with said particles includes the step of electrically biasing said shield member opposite to that charge of said ions within said plasma, for directing movement of said ion particles toward said shield member.

21. The method as recited in claim 19, including the step of generating said plasma by electric arc energy.

* * * * *